(12) United States Patent
Chen et al.

(10) Patent No.: US 7,481,504 B2
(45) Date of Patent: Jan. 27, 2009

(54) MOUNT LATCH STRUCTURE FOR A TELESCOPING SLIDE

(75) Inventors: Ken-Ching Chen, Kaohsiung Hsien (TW); Shih-Long Hwang, Kaohsiung Hsien (TW); Chun-Chiang Wang, Kaohsiung Hsien (TW)

(73) Assignee: King Slide Works Co., Ltd., Kaohsiung Hsien (TW)

( * ) Notice: Subject to any disclaimer, the term of this patent is extended or adjusted under 35 U.S.C. 154(b) by 5 days.

(21) Appl. No.: 11/285,038

(22) Filed: Nov. 23, 2005

(65) Prior Publication Data

US 2007/0114895 A1    May 24, 2007

(51) Int. Cl.
*A47B 88/04* (2006.01)

(52) U.S. Cl. .................... 312/333; 312/330.1

(58) Field of Classification Search ............ 312/333, 312/319.1, 334.44, 334.46, 334.47, 330.1, 312/334.45, 334.48; 211/191–192, 103, 211/187, 207–208; 384/18, 21, 22
See application file for complete search history.

(56) References Cited

U.S. PATENT DOCUMENTS

| | | | |
|---|---|---|---|
| 4,331,369 A | 5/1982 | Lazar | |
| 5,632,542 A | 5/1997 | Krivec | |
| 5,730,514 A * | 3/1998 | Hashemi | 312/333 |
| 6,123,314 A | 9/2000 | Steele | |
| 6,126,255 A * | 10/2000 | Yang | 312/334.46 |
| 6,209,979 B1 | 4/2001 | Fall | |
| 6,588,866 B2 | 7/2003 | Cheng | |
| 6,601,933 B1 | 8/2003 | Greenwald | |
| 6,938,967 B2 * | 9/2005 | Dubon et al. | 312/333 |
| 6,948,691 B2 * | 9/2005 | Brock et al. | 312/333 |
| 6,962,397 B2 * | 11/2005 | Dobler et al. | 312/333 |
| 7,101,081 B2 * | 9/2006 | Chen et al. | 312/334.46 |
| 7,156,477 B1 * | 1/2007 | Lu | 312/333 |
| 2001/0040203 A1 | 11/2001 | Brock | |
| 2002/0021061 A1 * | 2/2002 | Lammens | 312/334.44 |
| 2003/0141791 A1 | 7/2003 | Dubon | |
| 2004/0108797 A1 * | 6/2004 | Chen et al. | 312/334.7 |
| 2005/0088069 A1 | 4/2005 | Greenwald | |
| 2007/0018547 A1 * | 1/2007 | Yang et al. | 312/333 |

FOREIGN PATENT DOCUMENTS

TW    538716    6/2003

* cited by examiner

*Primary Examiner*—Hanh V. Tran
(74) *Attorney, Agent, or Firm*—Rosenberg, Klein & Lee

(57) ABSTRACT

A mount latch structure for a telescoping slide includes mounting holes disposed on an inner rail of the slide. A mounting member is provided adjacent to the mounting holes. Each of the mounting holes includes a vertical channel and a horizontal channel connected to each other. The mounting member is a resilient strap block having a first end locked to the inner rail and a second end facing the horizontal channel of the mounting hole. A hollowed channel is provided between the first and the second ends of the mounting member. Two resilient strap arms are formed on both longer sides of the hollowed channel.

1 Claim, 7 Drawing Sheets

MOUNT LATCH STRUCTURE FOR A TELESCOPING SLIDE

BACKGROUND OF THE INVENTION (a) Field of the Invention

The present invention relates to a mount latch structure for a telescoping slide, and more particularly to one allows fast mounting in position of a drawer or similar article.

(b) Description of the Prior Art

In addition to using screws or similar locking members to respectively fasten two inner rails of left and right slides to both sides of a wooden drawer or the like, or pins are provided to be incorporated with insertion hole and insertion plate of the telescoping slides in case of metal drawer or the like for mounting telescoping slides to the drawer or the like, there are more convenient means available from the prior art commonly observed in the cabinet products for computer servers and disclosed in U.S. Pat. Nos. 4,331,369, 5,632,542, 6,123, 314, 6,209,979 B1, 6,588,866 B2, and 6,601,933 B1, as well as U.S. patent application Nos. US 2001/0040203 A1, US 2003/0141791 A1, US 2004/0108797 A1, US 2005/0088069 A1, and Taiwan Patent Publication No. 538716 i.e., US 2004/0108797 A1.

All those prior arts cited above share common problems of running higher production cost of the mounting member, less convenience in assembling, and lower benefits as a general; furthermore, the user could easily get cut by burrs since most members are made of metal materials.

SUMMARY OF THE INVENTION

The primary purpose of the present invention is to provide a mount latch structure for a telescoping slide to solve those problems found with the prior art. To achieve the purpose, the slide includes an inner rail and an outer rail. The inner rail provided to receive the mounting by a drawer or the like comprises at least two mounting holes and a mounting member adjacent to one mounting hole. Wherein, the mounting hole includes a vertical channel and a horizontal channel connected to each other. The mounting member is a resilient strap block with a first end locked to an inner side of the inner rail and a second end facing the horizontal channel of the mounting hole. A hollowed channel is formed between the first and second ends of the mounting member to make both longer sides of the hollowed channel to each become a strap arm that allows resilient deformation and to further give the mounting member a pre-stress to be held in position. The drawer has on its sides provided with bolts corresponding in position to the mounting holes. The bolt has a head in a diameter larger than that of the bolt. When the bolt enters into the mounting hole and further into the vertical channel, the head forces to push against the second end of the mounting member for both resilient strap arms to develop transient deformation and allow the head of the bolt sliding into the horizontal channel of the mounting hole. Both strap arms return to their original shape and the mounting member is secured in place by having its second end holding against the head of the bolt.

Accordingly, when compared to the prior art, the present invention provides the following advantages:

1. Lower production cost since the mounting member may be made of plastic material.
2. Resilient strap arms and plastic material design for the mounting member prevent the user from being easily cut during operation.

DETAILED DESCRIPTION OF THE PREFERRED EMBODIMENTS

Figure 1:
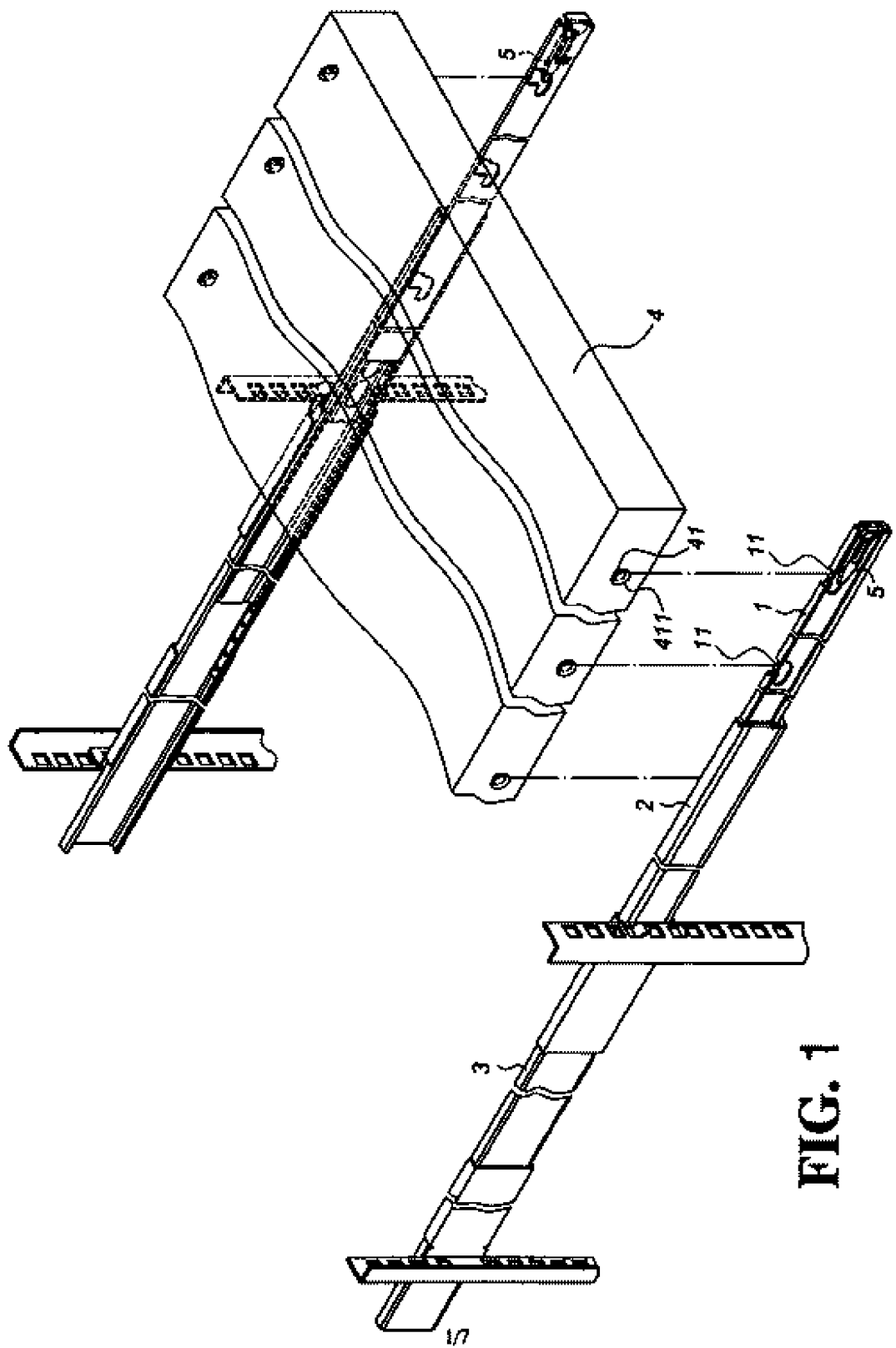
FIG. 1 is an exploded view of a first preferred embodiment of the present invention.

A mount latch structure for a telescoping slide of the present invention is used in the installation of a drawer or the like. As illustrated in FIG. 1, a drawer (4) allows to be fully pulled out by means of slides. The slide includes an inner rail (1), a middle rail (2) and an outer rail (3); or alternatively, the slide is composed of an inner rail and an outer rail to allow the drawer to be partially pulled out. However, either the three- or two-section configuration of the slide is a general practice and thus is not illustrated herein; furthermore, the present invention is not essentially characterized in the configuration of the slide. The present invention is characterized in the inner rail (1) to receive installation of the drawer (4).

Figure 2:
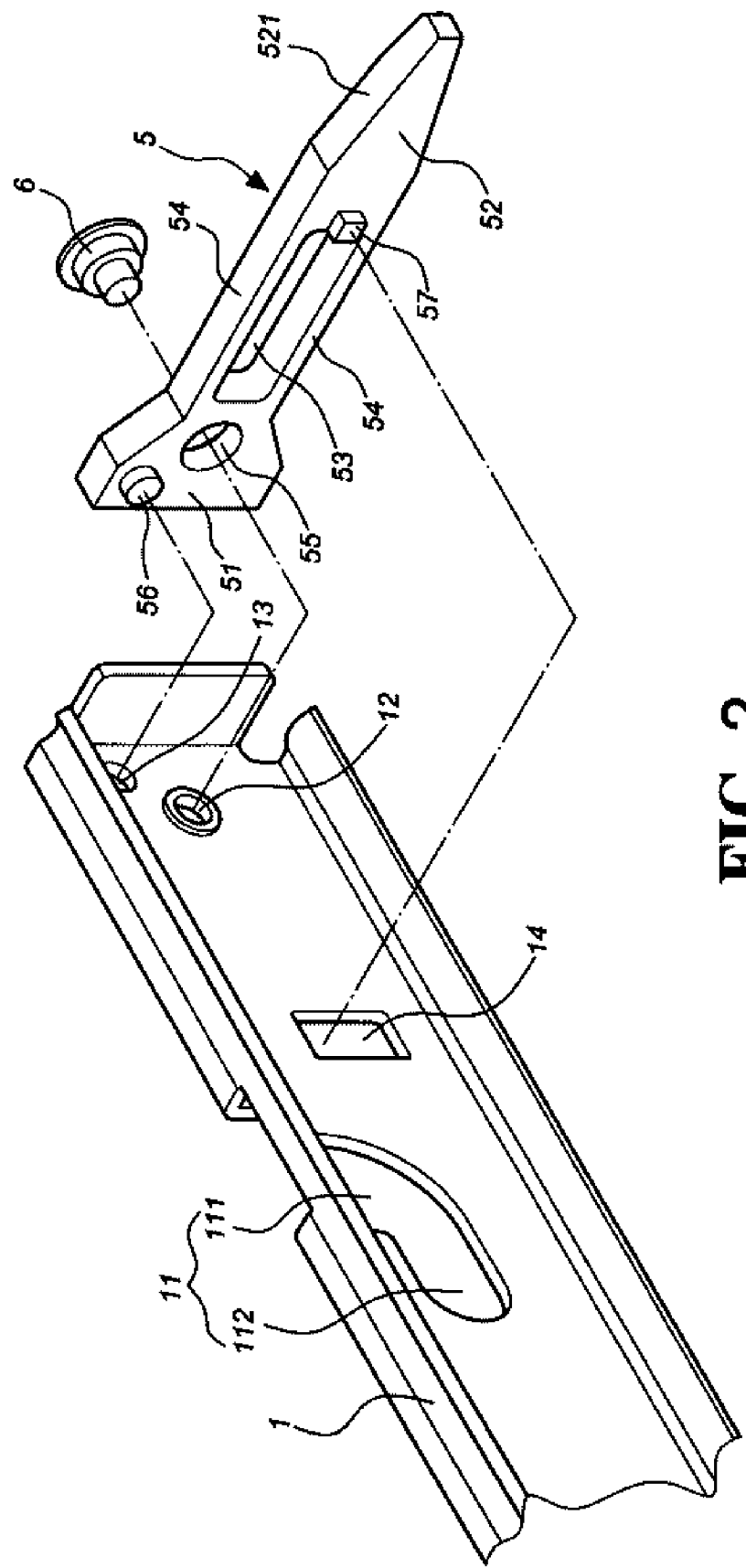
FIG. 2 is an exploded view of the primary construction of the first preferred embodiment of the present invention.

The inner rail (1) is provided with at least two mounting holes (11) and a mounting member (5). The mounting member (5) is adjacent to one of the mounting holes (11). Referring to FIG. 2, the mounting hole (11) includes a vertical channel (111) and a horizontal channel (112) connected to each other.

Figure 3:
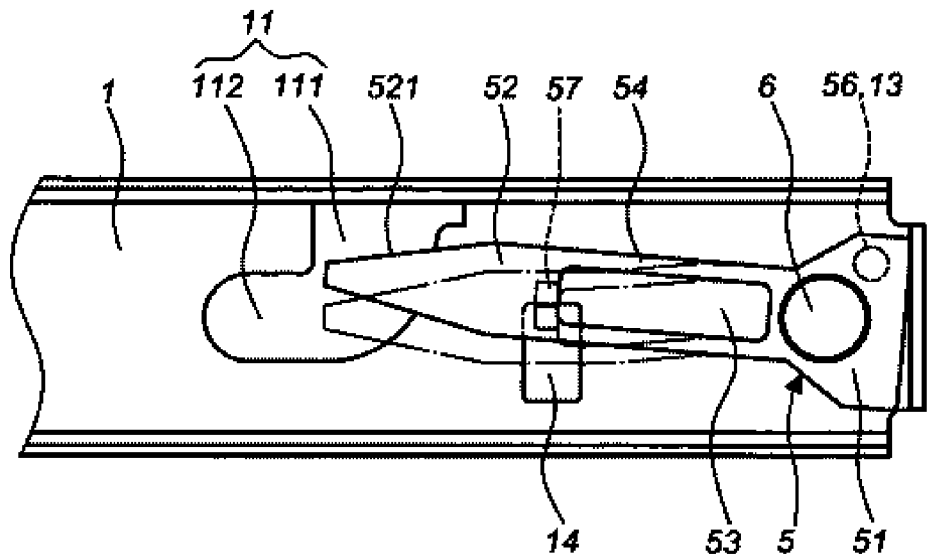
FIG. 3 is a side view showing an assembly of the primary construction of the first preferred embodiment of the present invention.
Figure 4:
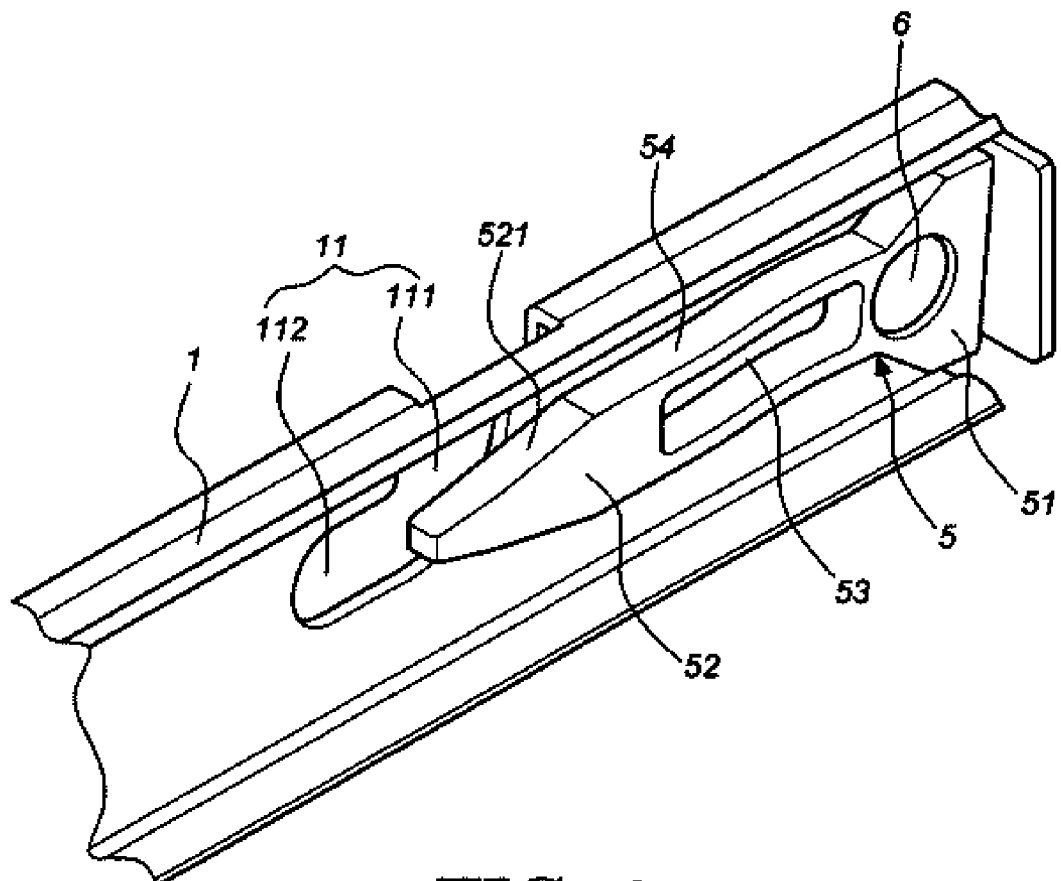
FIG. 4 is a perspective view showing the assembly of the primary construction of the first preferred embodiment of the present invention.

The mounting member (5) is a resilient strap block and has a first end (51) locked to an inner side of the inner rail (1) and a second end (52) facing the horizontal channel (112) of the mounting hole (11). A hollowed channel (53) is provided between the first and the second ends (51, 52) to define on each of both longer sides of the hollowed channel (53) a strap arm (54) that allows resilient deformation. The mounting member (5) is pre-stressed to secure in place. In the preferred embodiment of the pre-stressed mounting member (5), the first end (51) of the mounting member (5) is disposed with a central hole (55) and at least a positioning post (56) corresponding to a riveting hole (12) s and a positioning hole (13) disposed on the inner rail (1). A pin (6) penetrates and secures the mounting member (5) through the central hole (55) and the riveting hole (12). When the mounting member (5) is not pre-stressed, it is biased in relation to the horizontal channel (112) of the mounting hole (11) as illustrated in FIG. 3. A protruding bit (57) and a limiting hole (14) are disposed on the back of the second end (52) of the mounting member (5) and the inner side of the inner rail (1). When the protruding bit (57) is coupled to the limiting hole (14) as illustrated in FIG. 4, the second end (52) of the biased mounting member (5) is corrected so to become corresponding to the horizontal channel (112) of the mounting hole (11) and pre-stressed to increase the strength of the mounting member (5) to be held in place. A slope (521) is provided on top of the second end (52) of the mounting member (5).

Bolts (41) are provided on both sides of the drawer (4) corresponding in position to the mounting holes (11). Each bolt (41) comprises a head (411) having a diameter larger than that of the bolt (41).

Figure 5:
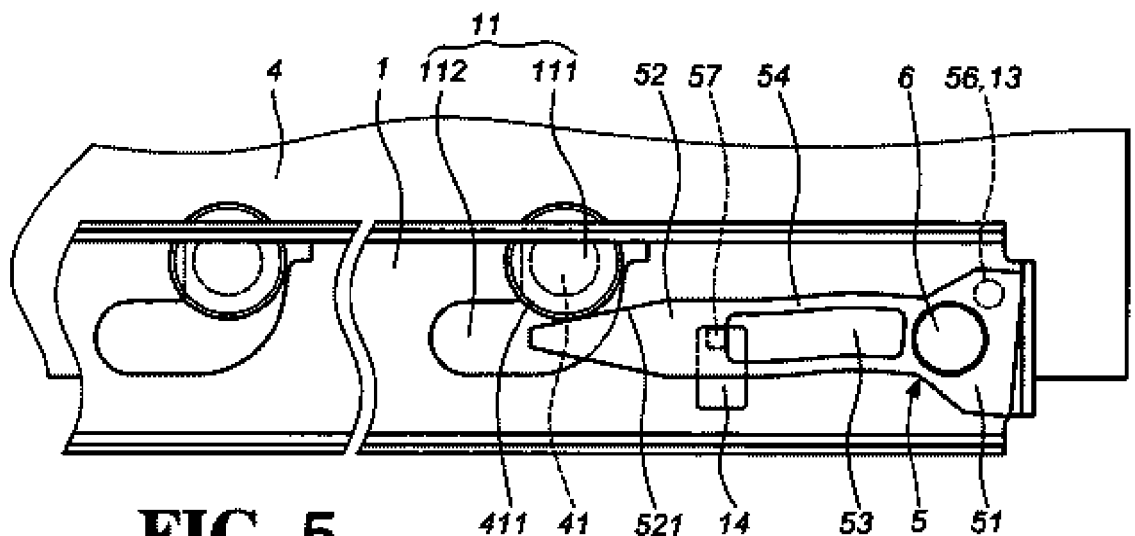
FIG. 5 is a schematic view showing installation of a mounting member in the first preferred embodiment of the present invention.
Figure 6:
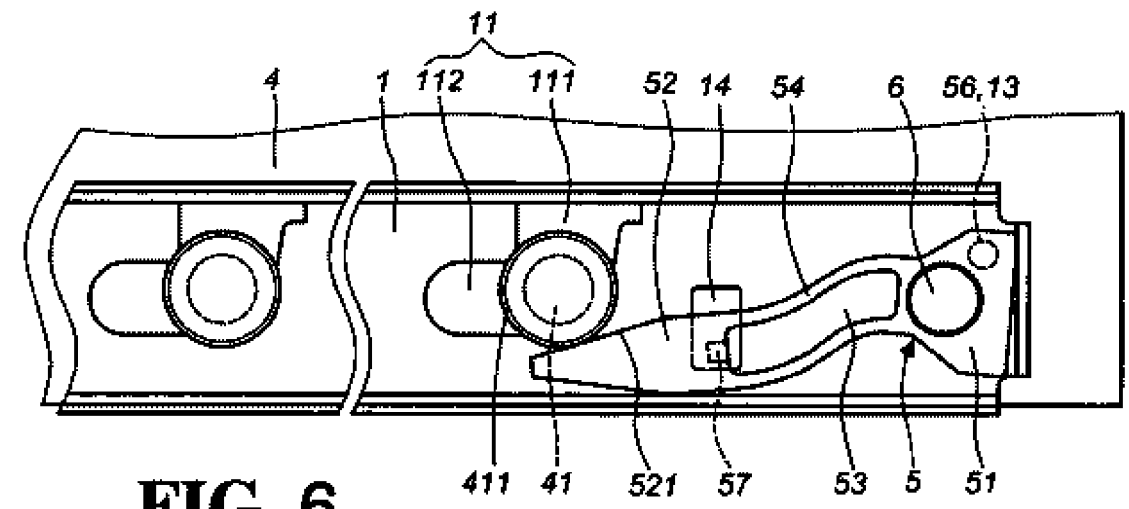
FIG. 6 is another schematic view showing installation of the mounting member in the first preferred embodiment of the present invention.
Figure 7:
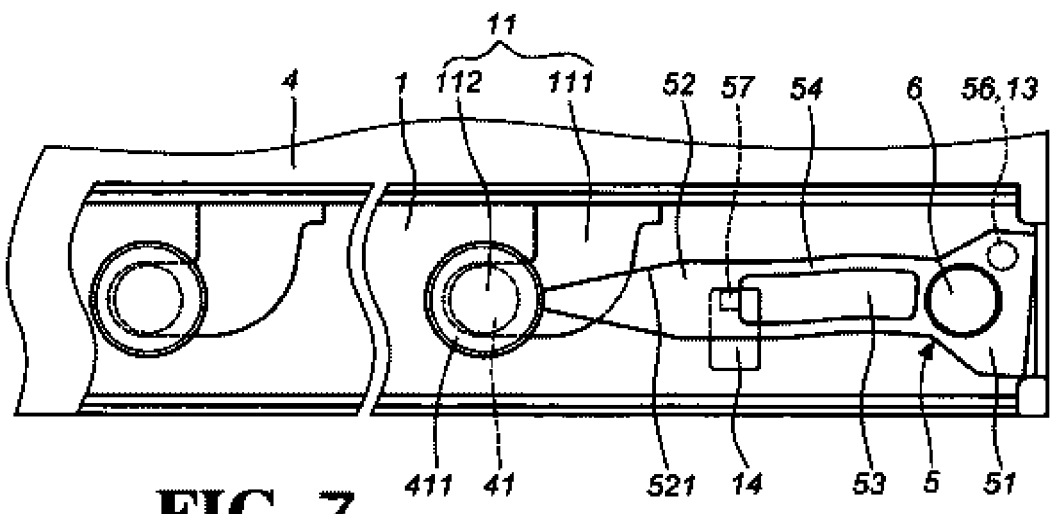
FIG. 7 is a schematic view showing the mounting member is secured in position in the first preferred embodiment of the present invention.

Accordingly, the bolt (41) of the drawer (4) hangs up downward the vertical channel (111) of the mounting hole (11) as illustrated in FIGS. 5 and 6, the head (411) of the bolt (41) is located on the inner side of the inner rail (1) to force pressing the slope (521) on the second end (52) of the mounting member (5) for the resilient strap arms (54) to undergo transient deformation, and naturally slides into the horizontal channel (112) of the mounting hole (11). Once the bolt (41) slides into the horizontal channel (112), the strap arms (54) return to their original shapes as illustrated in FIG. 7 with the front edge of the second end (52) holding against the head (411) of the bolt (41) to be secured in place, thus to secure the incorporated status between the inner rail (1) and the drawer (4).

Figure 8:
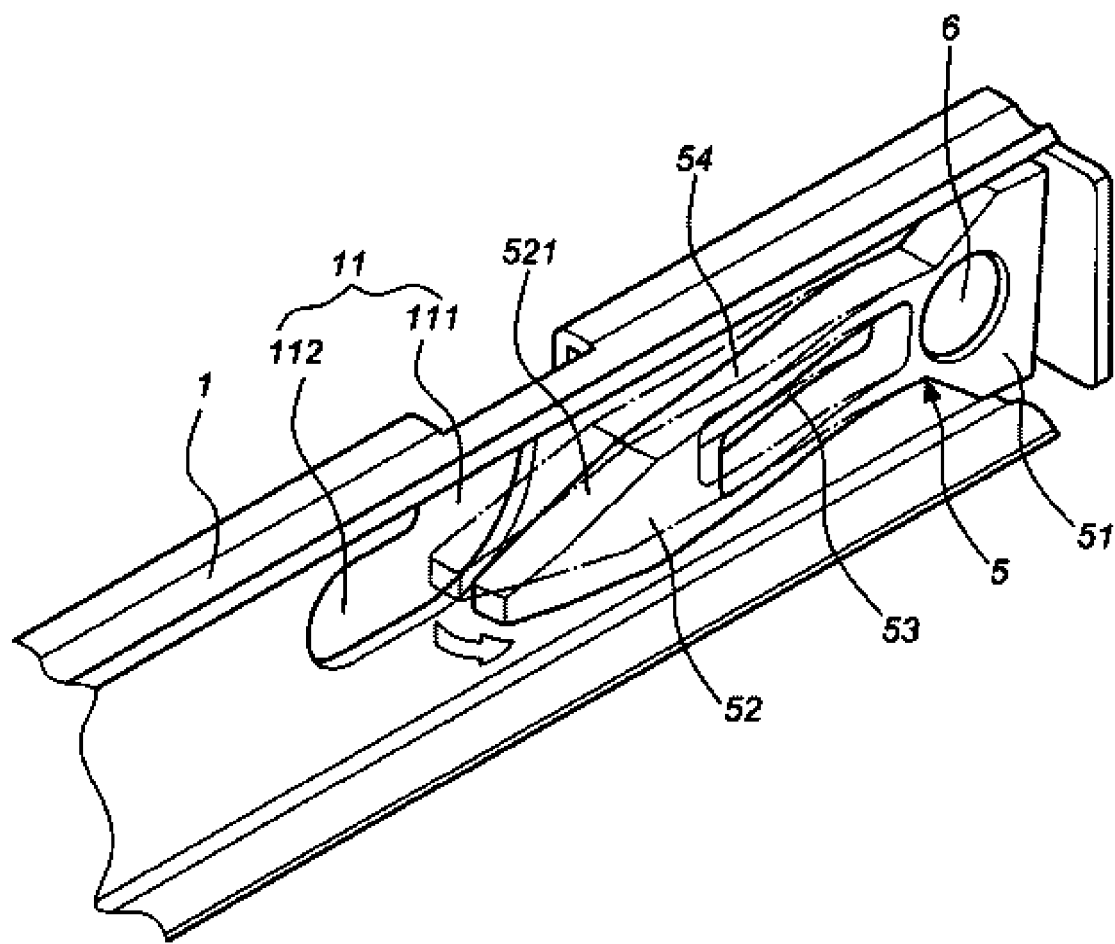
FIG. 8 is a schematic view simulating abnormal operation of the first preferred embodiment of the present invention.
Figure 9:
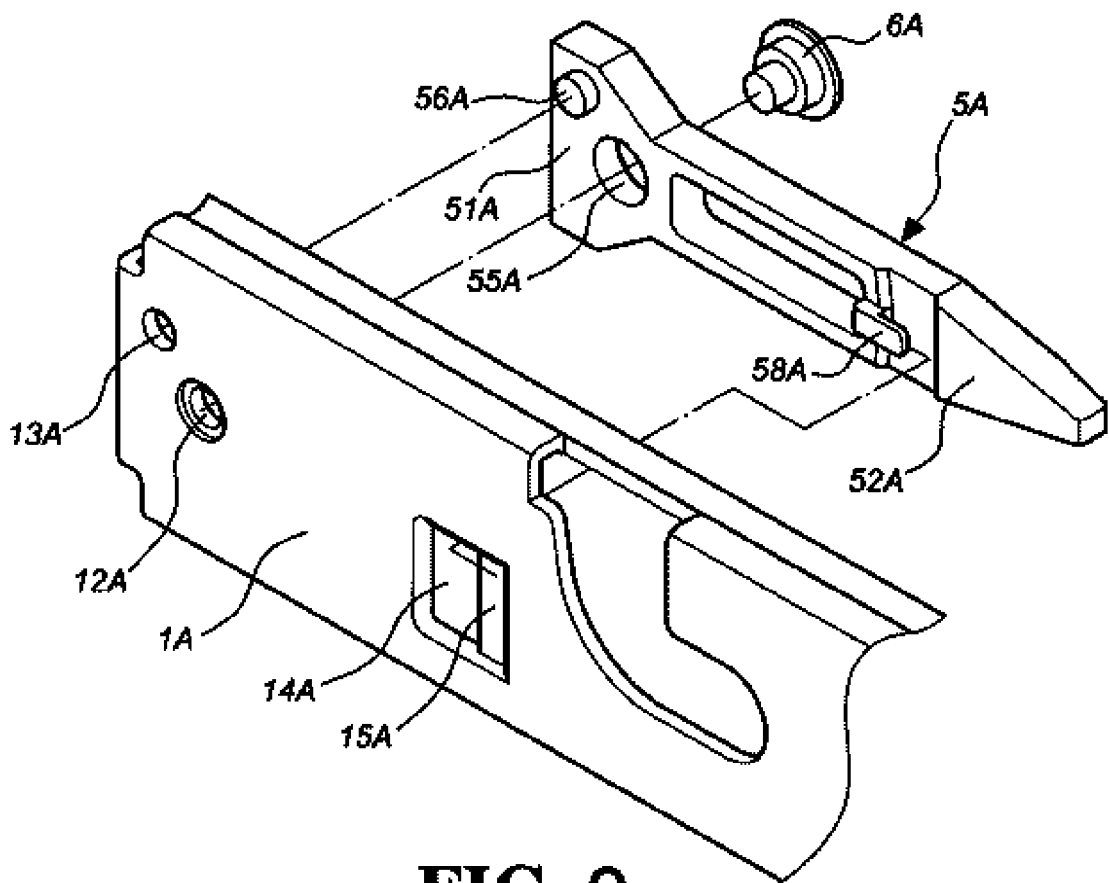
FIG. 9 is an exploded view of the primary construction of a second preferred embodiment of the present invention.
Figure 10:
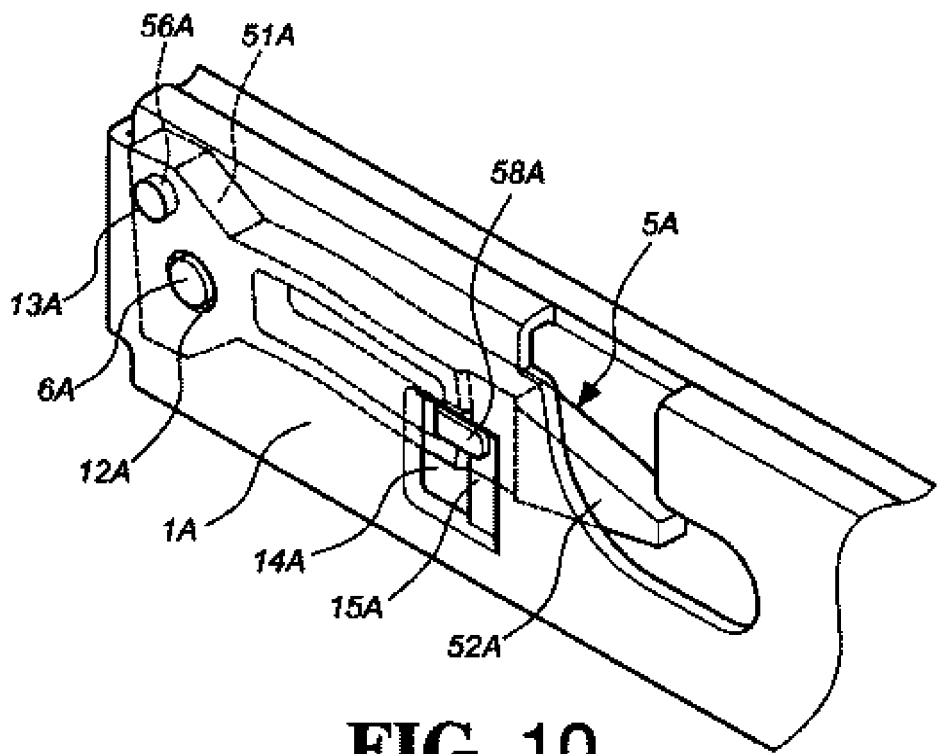
FIG. 10 is a schematic view showing an assembly of the primary construction of the second preferred embodiment of the present invention.

Now referring to FIG. 8, on considering that when the mounting member (5) has the first end (51) to be fixed to the inner side of the inner rail (1), the second end (52) of the mounting member (5) may be warped in the horizontal direction given with weak rebounding strength of the resilient strap arms (54) when subject to improper external force or pull by mistake resulting in improper deformation of the mounting member (5). Consequently, the second end (52) of the mounting member (5) can be easily pushed and warped by the head (411) of the bolt (41) to compromise the failure of the mounting member (5). To solve this potential problem, a central hole (55A) and a positioning post (56A) are disposed at a first end (51A) of a mounting member (5A) to correspond to a riveting hole (12A) and a positioning hole (13A) disposed on an inner rail (1A) as illustrated in FIGS. 9 and 10. A pin (6A) penetrates through the central hole (55A) and the riveting hole (12A). A hooking member (58A) is provided on the back of a second end (52A) of the mounting member (5A). A concave surface (15A) adjacent to a limiting hole (14A) is formed on the inner side of the rail (1A). The hooking member (58A) penetrates through the limiting hole (14A) hooks against the concave surface (15A) so to restrict the second end (52A) of the mounting member (5A) from being warped in its horizontal direction.

Figure 11:
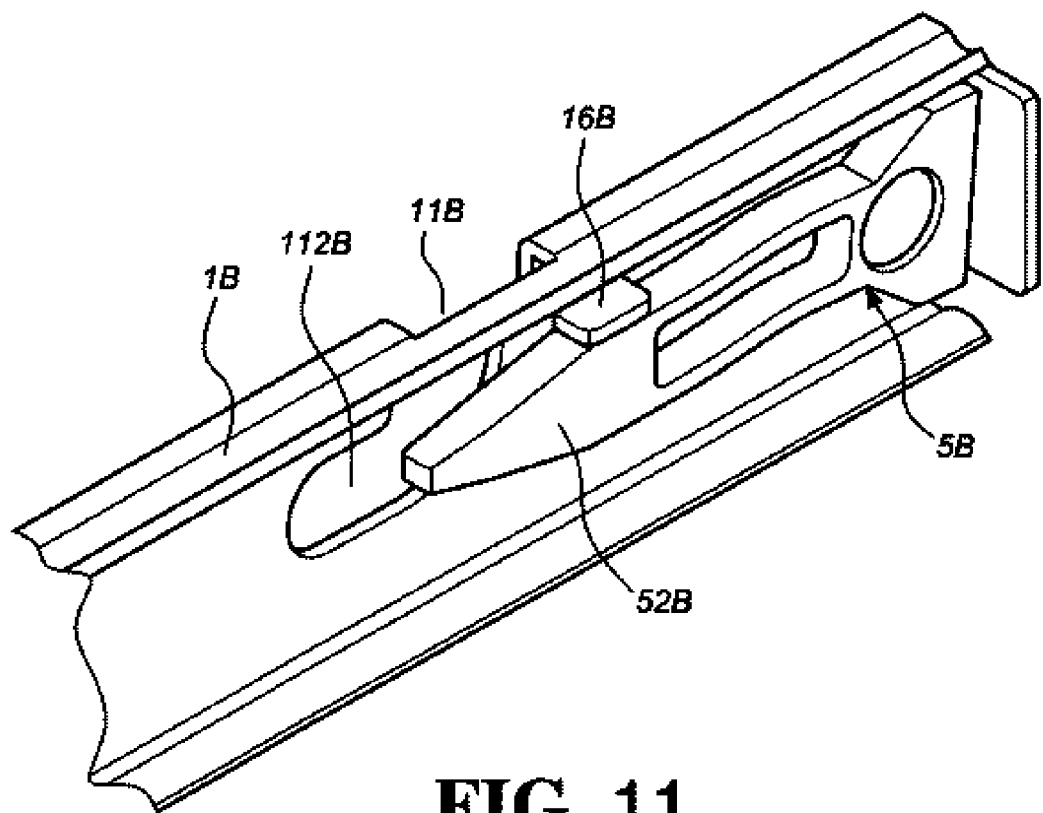
FIG. 11 is a schematic view showing an assembly of the primary construction of a third preferred embodiment of the present invention.
Figure 12:
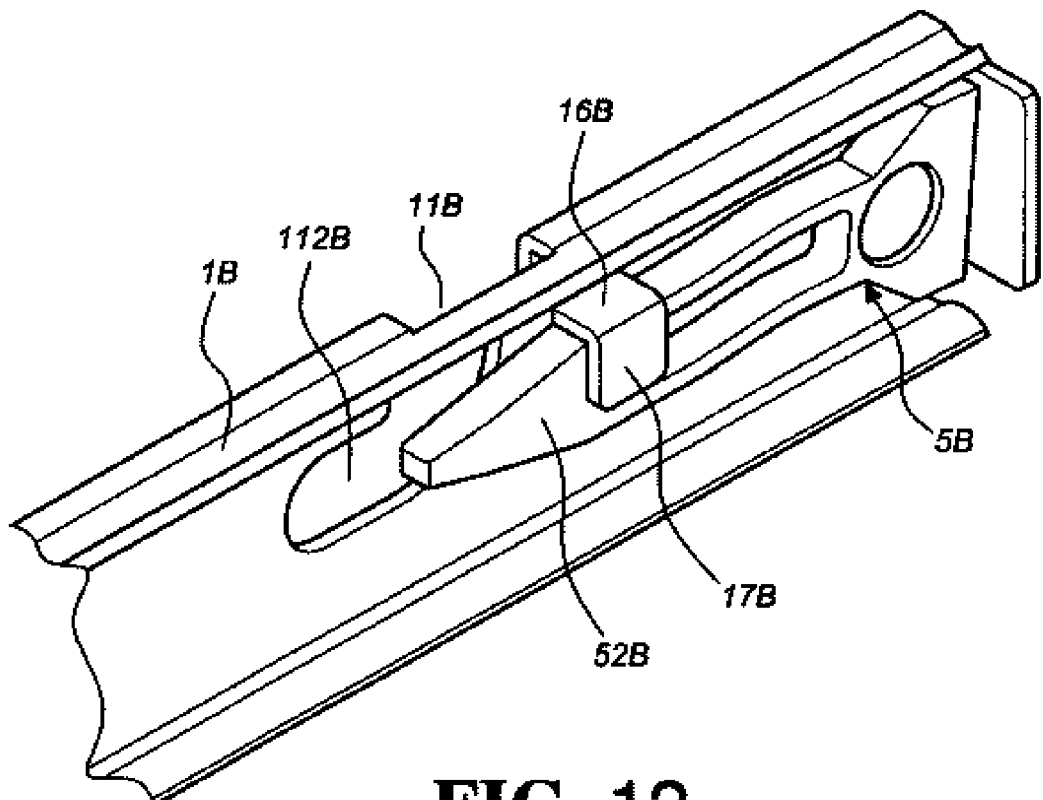
FIG. 12 is a schematic view showing an assembly of the primary construction of a fourth preferred embodiment of the present invention.

As illustrated in FIG. 11 for another preferred embodiment of the present invention, a retainer (16B) is provided on an inner rail (1B) to hold against an upper edge of a second end (52B) of a mounting member (5B) so to correct the biased second end (52B) of the mounting member (5B) for it to correspond to a horizontal channel (112B) of a mounting hole (11B) and to become pre-stressed. Furthermore, as illustrated in FIG. 12, a limiting plate (17B) extends downward from the top of the retainer (16B). The limiting plate (17B) holds against the top of the second end (52B) of the mounting member (5B) to restrict the second end (52B) of the mounting member (5B) from being warped in its horizontal direction.

What is claimed is:

1. A telescoping slide with a mount latch structure for use with a drawer, the slide comprising an inner rail and an outer rail;

the inner rail including mounting holes; a mounting member being disposed on an inner side of the inner rail adjacent to one of the mounting holes; each of the mounting holes including a vertical channel and a horizontal channel connected to each other; configured to receive a head of a bolt extending from a side of the drawer; the mounting member being a resilient strap block; a first end of the mounting member being locked to the inner side of the inner rail; a second end of the mounting member facing the horizontal channel of the mounting hole; a hollowed channel being provided between the first and the second ends of the mounting member; two resilient strap arms being formed on both longer sides of the hollowed channel; and a slope being formed on the top of the second end of the mounting member, wherein the first end of the mounting member is disposed with a central hole corresponding to a riveting hole provided on the inner rail; a positioning post being disposed on the first end of the mounting member and received within a corresponding positioning hole provided on the inner rail to pivot the mounting member relative to the horizontal channel; a pin penetrating through the central hole and the riveting hole to secure the mounting member to the inner rail; a protruding bit being disposed on the back of the second end of the mounting member corresponding to a limiting hole provided on the inner side of the inner rail; the protruding bit and the limiting hole being held against each other to pre-stress the mounting member and forcing the second end of the mounting member to correspond to the horizontal channel of the mounting hole.

* * * * *